(12) United States Patent
Mu

(10) Patent No.: US 7,978,009 B2
(45) Date of Patent: Jul. 12, 2011

(54) DIGITAL MODULATED RF POWER AMPLIFIER WITH IMPEDANCE COMPENSATION CIRCUIT

(75) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 22 days.

(21) Appl. No.: 12/630,320

(22) Filed: Dec. 3, 2009

(65) Prior Publication Data

US 2011/0025415 A1 Feb. 3, 2011

Related U.S. Application Data

(60) Provisional application No. 61/230,820, filed on Aug. 3, 2009.

(51) Int. Cl.
*H03F 3/45* (2006.01)
(52) U.S. Cl. ........................................................ 330/253
(58) Field of Classification Search .................. 330/252, 330/253
See application file for complete search history.

(56) References Cited

U.S. PATENT DOCUMENTS

| | | | |
|---|---|---|---|
| 6,215,355 B1 | 4/2001 | Meck et al. | |
| 7,183,844 B2 | 2/2007 | Klomsdorf et al. | |
| 7,202,747 B2 | 4/2007 | Forse et al. | |
| 7,405,685 B2 | 7/2008 | Rezeq et al. | |
| 7,773,693 B2 * | 8/2010 | Brobston | 375/298 |
| 2003/0025561 A1 | 2/2003 | Hoheisel et al. | |
| 2006/0078067 A1 | 4/2006 | Brobston | |
| 2009/0066440 A1 | 3/2009 | Chan Wai Po et al. | |

FOREIGN PATENT DOCUMENTS

| | | | |
|---|---|---|---|
| WO | 2006/033722 A2 | 3/2006 | |
| WO | 2007/122562 A2 | 11/2007 | |

* cited by examiner

*Primary Examiner* — Steven J Mottola
(74) *Attorney, Agent, or Firm* — Coats & Bennett, P.L.L.C.

(57) ABSTRACT

A digital modulated power amplifier unit includes a differential radio frequency (RF) amplifier circuit having differential output nodes, a digital modulation signal input and complimentary clock signal inputs. The differential RF amplifier circuit includes a first pair of transistors operable to receive a digital modulation signal and a second pair of transistors operable to receive complimentary clock signals. The digital modulated power amplifier unit further includes an impedance compensation circuit connected between the differential output nodes of the differential RF amplifier circuit. The impedance compensation circuit includes a transistor connected in series between first and second RC circuits. The transistor is operable to electrically connect and disconnect the first RC circuit and the second RC circuit responsive to the digital modulation signal.

25 Claims, 9 Drawing Sheets

DIGITAL MODULATED RF POWER AMPLIFIER WITH IMPEDANCE COMPENSATION CIRCUIT

RELATED APPLICATIONS

This application claims priority from the U.S. provisional patent application filed on Aug. 3, 2009, and assigned Application No. 61/230,820, and that application is incorporated herein in its entirety.

TECHNICAL FIELD

The present invention generally relates to digital modulated radio frequency (RF) power amplifiers, and more particularly relates to impedance compensation for digital polar modulated differential RF power amplifier circuits.

BACKGROUND

Existing RF transmitters can be classified mainly into two types: quadrature modulated transmitters or polar modulated transmitters. A conventional quadrature modulated RF transmitter typically includes a baseband digital signal processor (DSP), two digital-to-analog converters (DACs), low pass filters (LPFs) for quadrature channels, a quadrature modulator, a variable gain amplifier (VGA) and a power amplifier (PA). A conventional polar modulated RF transmitter typically includes a baseband DSP, DACs and LPFs for the amplitude modulation path and phase modulation path. The phase modulation path changes carrier clock phases used in the amplitude modulation path. The amplitude modulation path creates a modulated RF signal. A proper delay is required to match the amplitude modulation path and the phase modulation path. A power amplifier enlarges the amplitude of the modulated RF signal.

Conventional RF transmitter architectures have a problem reaching good linearity and power efficiency simultaneously, as good linearity usually implies high power consumption, because the analog components operate as class A devices, resulting in poor power efficiency. In addition, active and passive components, such as filter capacitors and large transistors for minimizing flicker noise, occupy additional silicon area which increases cost. Furthermore, analog circuits are highly sensitive to process, temperature and supply voltage variation. Device matching is also a problem for deep submicron CMOS (Complimentary Metal Oxide Semiconductor) technologies. Because conventional RF transmitter architectures have separate modulator and power amplifier components, redundant areas are created in the modulator and the amplifier for the transmitter architectures. In addition, conventional digital quadrature modulators typically drive a 50 Ohm impedance, and thus power consumption tends to be relatively high at the modulator output. Non-linear distortion is also difficult to compensate for conventional power amplifiers and modulators, as they are located in different chips where the environments differ, and this gives rise to additional interference in the radio band. Since a power amplifier is not typically included as part of a conventional digital quadrature modulator, system integration is not optimized which further increases the cost of the final RF transmitter structure.

SUMMARY

To relax the design difficulty associated with analog circuits and reduce area and power consumption, a digital polar modulated power amplifier which merges the DAC, LPF, modulator, VGA and PA functions together into a digital cell is disclosed herein.

Through a digital modulation signal, the output amplitude of the digital polar modulated RF power amplifier can be changed digitally, thus the RF output amplitude is modulated. However, the output impedance for many types of digital RF power amplifiers can change as a function of the modulation signal. For example, digital RF power amplifiers actively switch between enabled and disabled states during normal modulation operation. This switching causes the power amplifier output impedance to change in both amplitude and phase, leading to poor Error Vector Magnitude (EVM).

To overcome this problem, a digital modulated differential RF power amplifier unit comprising a differential RF amplifier circuit with impedance compensation is disclosed herein. The digital modulated differential RF power amplifier unit removes the undesired parasitic phase modulation during amplitude modulation.

According to the methods and apparatus disclosed herein, an impedance compensation circuit is designed for use with the differential RF power amplifier circuits whose output impedance changes as a function of modulation signal.

According to an embodiment of the impedance compensation circuit, the impedance compensation circuit includes a transistor connected in series between first and second RC circuits. The transistor electrically connects and disconnects the first RC circuit and the second RC circuit responsive to the digital modulation signal. The digital modulation signal also controls the operating state of the differential RF power amplifier circuits. Coupling and decoupling the RC circuits in this way causes the impedance of the compensation circuit to change, counteracting or offsetting the output impedance of the differential circuit. In one embodiment, the digital polar modulated power amplifier is formed by paralleling a plurality of the digital modulated differential PA units with impedance compensation circuits, where two or more differential RF power amplifier circuits may share a single impedance compensation circuit. The impedance compensation circuits are connected to the differential outputs of the differential RF amplifier circuit and an RF load. The impedance compensation circuits ensures that the total impedance seen by the load looking into the digital polar modulated power amplifier remains relatively constant and matches that of the load regardless of the operating state of the differential RF power amplifier circuits that form the digital modulated polar power amplifier.

The digital polar modulated PA utilizes DSP and other digital techniques to perform baseband signal processing, such as gain setting, over-sampling, interpolation and low pass filtering. In the final stage of the digital polar modulated PA, the carrier clock signals are modulated by digital baseband signals and converted into modulated RF signals. Because the digital baseband signals have smaller distortion than their analog counterparts, depending on the digital signal processing accuracy or word length which is normally enough, linearity is improved. In addition, the area occupied may be smaller than that occupied by the equivalent analog components because large capacitors are not needed. An RF transmitter including the digital polar modulated power amplifier is disclosed as well.

According to an embodiment of a digital modulated power amplifier unit, the unit includes a differential radio frequency (RF) amplifier circuit having differential output nodes, a digital modulation signal input and complimentary clock signal inputs. The differential RF amplifier circuit includes a first pair of transistors operable to receive a digital modulation signal and a second pair of transistors operable to receive complimentary clock signals. The digital modulated power amplifier unit further includes an impedance compensation circuit connected between the differential output nodes of the differential RF amplifier circuit. The impedance compensation circuit includes a transistor connected in series between first and second RC circuits. The transistor is operable to electrically connect and disconnect the first RC circuit and the second RC circuit responsive to the digital modulation signal.

Of course, the present invention is not limited to the above features and advantages. Those skilled in the art will recognize additional features and advantages upon reading the following detailed description, and upon viewing the accompanying drawings.

DETAILED DESCRIPTION

A digital modulated RF power amplifier can be created by merging K identical small digital modulated RF amplifier units together in such a way that the differential output nodes of the digital modulated RF power amplifier are connected to the differential output nodes of each of the digital modulated RF amplifier units, where K is an integer. Each of the digital modulated RF amplifier units has differential clock input nodes connected to RF carrier clocks, and an enable input node connected to a bit of modulation signal vector $M(1:K) = \{m_1, m_2, \ldots, m_K\}$. The output of the digital modulated RF power amplifier is connected to an RF load Z, thus each digital modulated RF amplifier unit equivalently drives a load ZL=Z/K.

Figure 1:
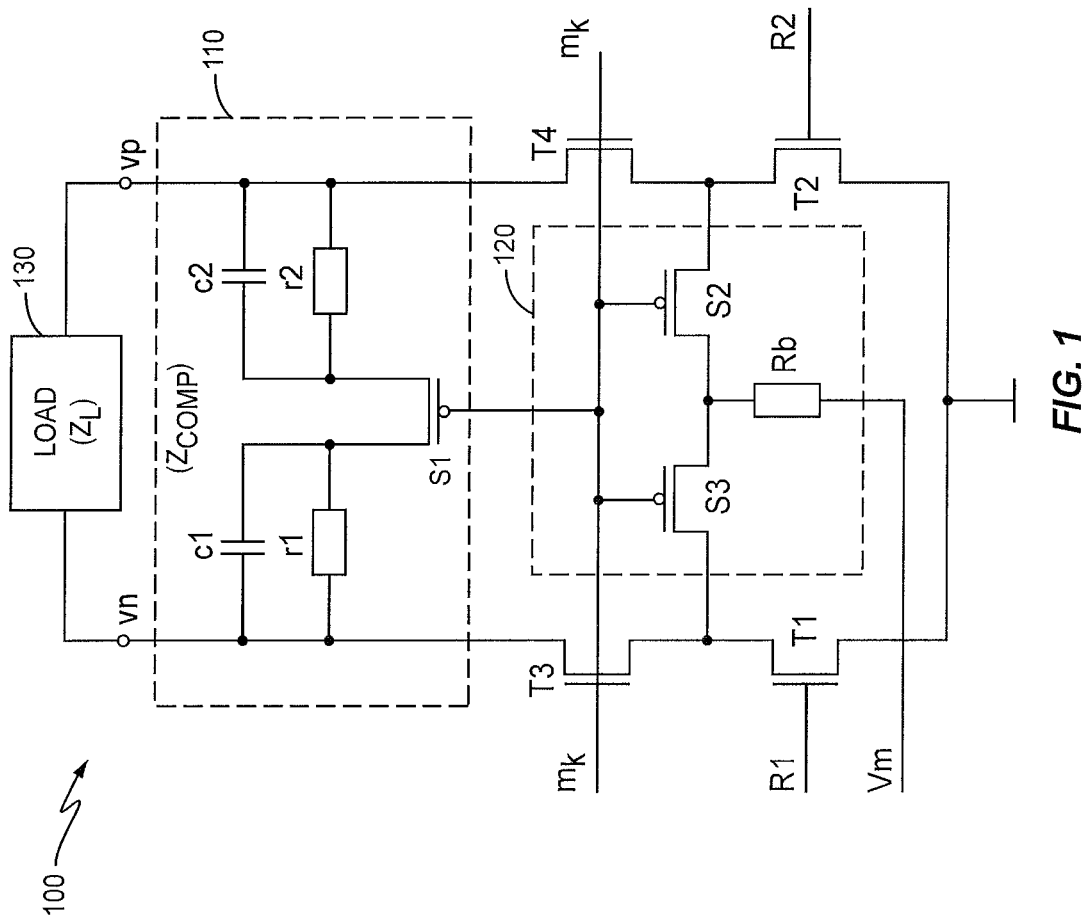
FIG. 1 illustrates a circuit diagram of an embodiment of a digital modulated power amplifier (DMPA) unit with an impedance compensation circuit.

FIG. 1 illustrates an embodiment of a digital modulated power amplifier (DMPA) unit 100 with an impedance compensation circuit 110 and a shut-down circuit 120 for implementing the digital modulated RF power amplifier. According to this embodiment, transistors T1 and T2 are connected to the complementary LO clock signals R1 and R2, respectively. Transistors T3 and T4 are controlled by digital amplitude modulation signal $m_k$ and perform a multiplication operation.

In general, the multiplication operation carried out between modulation signal m and LO clock signal R can be replaced with parallel logic switched adder array represented by:

$$Y = m \cdot R = \left(\sum_{k=1}^{N} m_k\right) \cdot R = \sum_{k=1}^{N} (m_k \cdot R) \quad (1)$$

Transistors T1 and T2 are configured as common source transistors and provide gain gm. Transistors T3 and T4 are configured as common gate transistors and provide high voltage output. Transistors T3 and T4 can be fabricated with thick oxide LDMOS (laterally diffused metal oxide semiconductor) transistors to achieve high break-down voltage. In addition, transistors T3 and T4 have a significantly high cut-off frequency since they are configured as common gate transistors.

The common-source/common-gate structure shown in FIG. 1 is well-suited for power amplifier stages. Implementing the DMPA unit 100 as a differential component yields twice the output amplitude compared to a single-ended output and all even order harmonics and inter-modulation products are cancelled, yielding less spurious emissions. The impedance compensation and shut-down circuitry further improve the performance of the DMPA unit 100.

The impedance compensation circuit 110 is connected between the differential output nodes (vn, vp) of the DMPA unit 100 which in turn is connected to a load 130. The impedance compensation circuit 110 ensures that the total impedance seen by the load 130, which includes the DMPA unit output impedance ($Z_o$) and the compensation circuit impedance ($Z_{comp}$), remains relatively constant and matches that of the load ($Z_L$) regardless of the operating state of the DMPA unit 100. The output impedance Zo of the DMPA unit 100 changes as a function of the operating state of the DMPA unit 100. For example, the DMPA unit 100 may have relatively high output impedance in a first operating state and relatively low output impedance in a second operating state, or vice-versa. The impedance $Z_{comp}$ provided by the compensation circuit 110 is a function of the operating state of the DMPA unit 100 so that changes in the output impedance Zo of the DMPA unit 100 can be counteracted or offset. This way, the load 130 sees approximately the same impedance regardless of the DMPA unit operating state.

The impedance compensation circuit 110 includes two RC circuits (c1/r2, c2/r2) and a control transistor (S1) connected between the RC circuits. The first RC circuit includes a capacitor (c1) connected in parallel with a resistor (r1) between a first terminal of control transistor S1 and differential output node vn of the DMPA unit 100. The second RC circuit similarly includes a capacitor (c2) connected in parallel with a resistor (r2) between a second terminal of control transistor S1 and the complimentary differential output node vp of the DMPA unit 100. The control transistor S1 electrically connects or disconnects the first and second RC circuits as a function of the operating state of the DMPA unit 100.

In one embodiment, the output impedance Zo of the DMPA unit 100 increases when the DMPA unit 100 is disabled. To account for the increase in the output impedance, the digital modulation signal $m_k$ applied to the gate of control transistor S1 causes transistor S1 to electrically connect the first and second RC circuits, thus decreasing the impedance of the compensation circuit 110 and keeping the impedance seen from the load 130 unchanged. The impedance of the compensation circuit 110 has a value given by:

$$Z_{comp} = \frac{2Z_r Z_c}{Z_r + Z_c} + Z_{S1} \qquad (1)$$

where $Z_r$ is the impedance of resistor r1 and r2, $Z_c$ is the impedance of capacitor c1 and c2, and $Z_{S1}$ is the impedance of control transistor S1.

Responsive to the DMPA unit 100 being re-enabled, modulation signal $m_k$ switches control transistor S1 off, electrically decoupling the first and second RC circuits. The impedance of the compensation circuit 110 and the output impedance $Z_o$ of the DMPA unit 100 are paralleled to match the load ZL so that regardless of whether the DMPA unit 100 is enabled or disabled, the following equation is kept approximately constant:

$$Z_L = \frac{Z_o Z_{COMP}}{Z_o + Z_{COMP}} \qquad (2)$$

It can also be written in terms of admittance:

$$G_L = G_O + G_{COMP} \qquad (3)$$
$$= G_{O\_EN} + G_{COMP\_OFF}$$
$$= G_{O\_DIS} + G_{COMP\_ON}$$

Here, $G_O$ and $G_{COMP}$ are the admittances of $Z_O$ and $Z_{COMP}$, respectively. $G_{O\_EN}$ and $G_{COMP\_OFF}$ are the admittances when the DMPA unit 100 is enabled, and $G_{O\_DIS}$ and $G_{COMP\_ON}$ are the admittances when the DMPA unit 100 is disabled. Equation (3) should be met in both states when the DMPA unit 100 is enabled or disabled.

The digital modulation signal $m_k$ applied to the gate of control transistor S1 is a function of the operating state of the DMPA unit 100. In one embodiment, control transistor S1 is a PMOS transistor as shown in FIG. 1. Alternatively, the control transistor can be an NMOS transistor and complimentary modulation signaling is used. In either case, the modulation signal $m_k$ is activated and deactivated based on the operating state of the DMPA unit 100 to ensure that the load sees relatively constant impedance. When the control transistor S1 is switched on, the compensation impedance $Z_{comp}$ as given by equation (1) is seen by the load across the differential output nodes vn and vp of the DMPA unit 100. Conversely, the impedance compensation circuit 110 essentially has no effect on the load when the control transistor S1 is switched off. Thus, the impedance compensation circuit 110 ensures that the impedance seen by the load 130 is relatively well matched during operation of the DMPA unit 110.

The shutdown circuit 120 coupled to the DMPA unit 100 includes PMOS control transistors S2 and S3, each of which conducts when the digital amplitude modulation signal $m_k$ is logic low, i.e. when the DMPA unit 100 is disabled. When PMOS control transistor S1 is conducting, the output impedance of the DMPA unit 100 remains relatively unchanged in both enabled and disabled states as explained above. When PMOS control transistors S2 and S3 are conducting, clock leakage is removed from the output nodes vn and vp. Also, floating nodes at the drains of the RF transistors T1 and T2 are connected to a bias voltage (Vm) via a resistor (Rb) when the DMPA unit 100 is disabled. Accordingly, the shutdown circuit provides a weak DC current leakage to the drains of the RF transistors T1 and T2 when the DMPA unit 100 is disabled and maintains a certain voltage potential close to the operating voltage when the DMPA unit 100 is enabled. As a result, switching disturbances caused by charging and discharging during a transition from the enabled to disabled state, or vice versus, is reduced. Control transistors S1-S3 can be replaced by NMOS transistors and inverse control logic signaling. Also, additional common gate configured NMOS transistors can be included in the impedance compensation circuit 110 between the drain of NMOS transistor T3 and output node vp and the drain of NMOS transistor T4 and output node vn to relax the break-down requirements for transistors T3 and T4.

Figure 2:
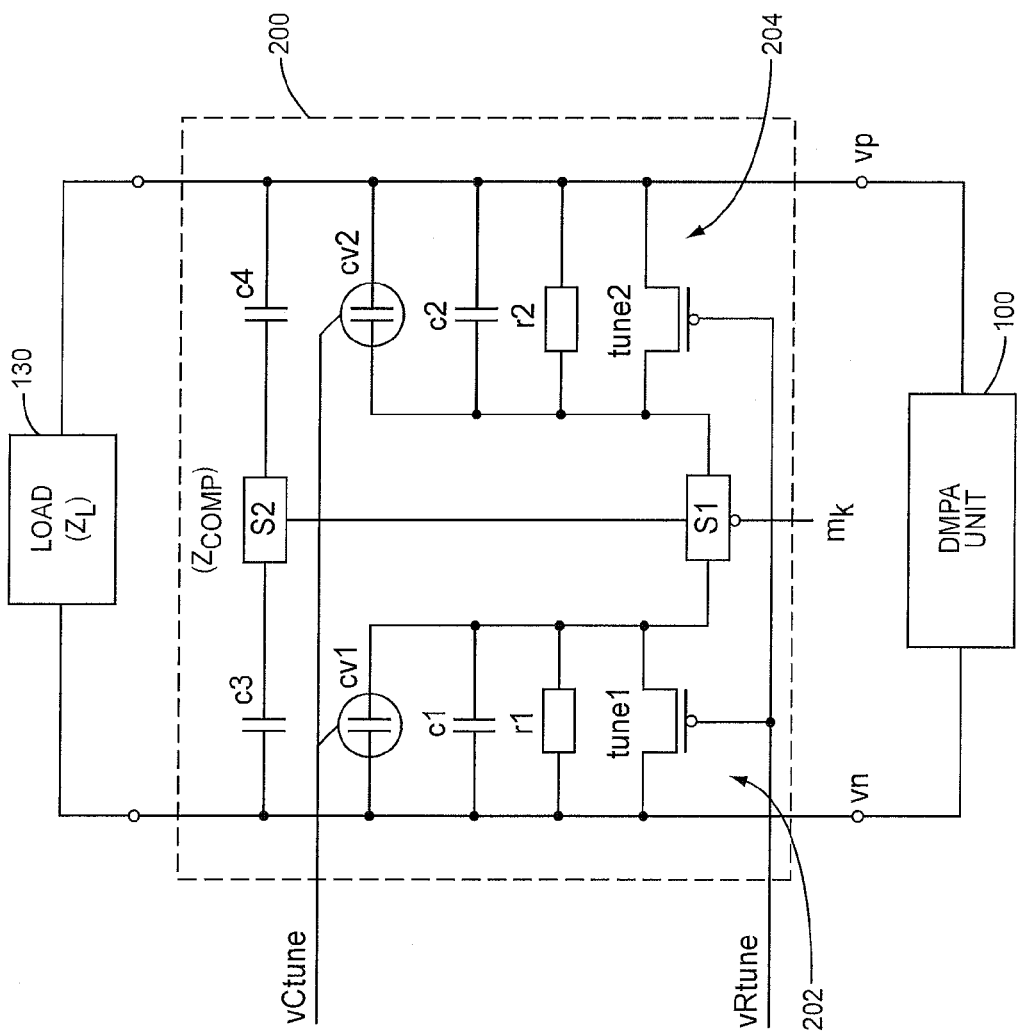
FIG. 2 illustrates a circuit diagram of another embodiment of an impedance compensation circuit used in the DMPA unit of FIG. 1.

FIG. 2 illustrates another embodiment of an impedance compensation circuit 200 for use with the DMPA unit 100. According to this embodiment, each RC circuit 202, 204 (c1||r1 and c2||r2) of the impedance compensation circuit 200 further includes a tunable capacitive device (cv1, cv2) and a tunable resistive device (tune1, tune2) connected in parallel with the resistor (r1, r2) and capacitor (c1, c2) of the corresponding RC circuit 202, 204. Capacitors c1 and c2 and resistors r1 and r2 provide impedance compensation as a function of the operating state of the DMPA unit 100 connected to the compensation circuit 200 as previously described herein. Transistors tune1 and tune2 controlled by a tuning voltage vRtune, behave as variable resistance devices which provide fine tuning for resistance matching. Similarity, varactors cv1 and cv2 controlled by another tuning voltage, vCtune, behave as variable capacitance devices which provide fine tuning for capacitance matching. The tunable capacitive and resistive devices enable more precise impedance matching.

The impedance compensation circuit 200 optionally includes additional capacitors (c3 and c4) and an additional NMOS control transistor (S2). Control transistor S2 electrically connects the additional capacitance associated with capacitors c3 and c4 between the differential output nodes (vn, vp) of the DMPA unit 100 as a function of the operating state of the DMPA unit 100. In one embodiment, capacitors c3 and c4 are connected between the differential output nodes vn and vp when the DMPA unit 100 is enabled and disconnected from the load 120 when the DMPA unit 100 is disabled. Control transistors S1 and S2 are actuated by the same digital modulation signal ($m_k$), but transistor S2 functions in a complementarily manner compared to transistor S1. That is, if S1 is on S2 is off and vice-versa. In some cases, capacitors c3 and c4 may correspond to a parasitic capacitance of the DMPA unit, 100 and in other cases, capacitors c1 and c2 may be parasitic, depending on the value of the parasitic capacitance between enabled state and disabled state of the DMPA unit 100. If the value of the parasitic capacitance of the DMPA unit 100 when enabled is larger than that of the DMPA unit 100 when disabled, then c3, c4 and S2 are required and c1 and c2 are optional, otherwise c3 and c4 are required and c1 and c2 are optional. In either case, the impedance compensation circuit 200 provides resistive and capacitive fine tuning capability while accounting for parasitic capacitance of the DMPA unit 100.

The impedance compensation circuits 110/200 previously described herein, maintain the phase of the output RF signal as a constant and extend the linearity operating region while performing amplitude modulation, thus improving the EVM and increasing power efficiency.

Figure 3:
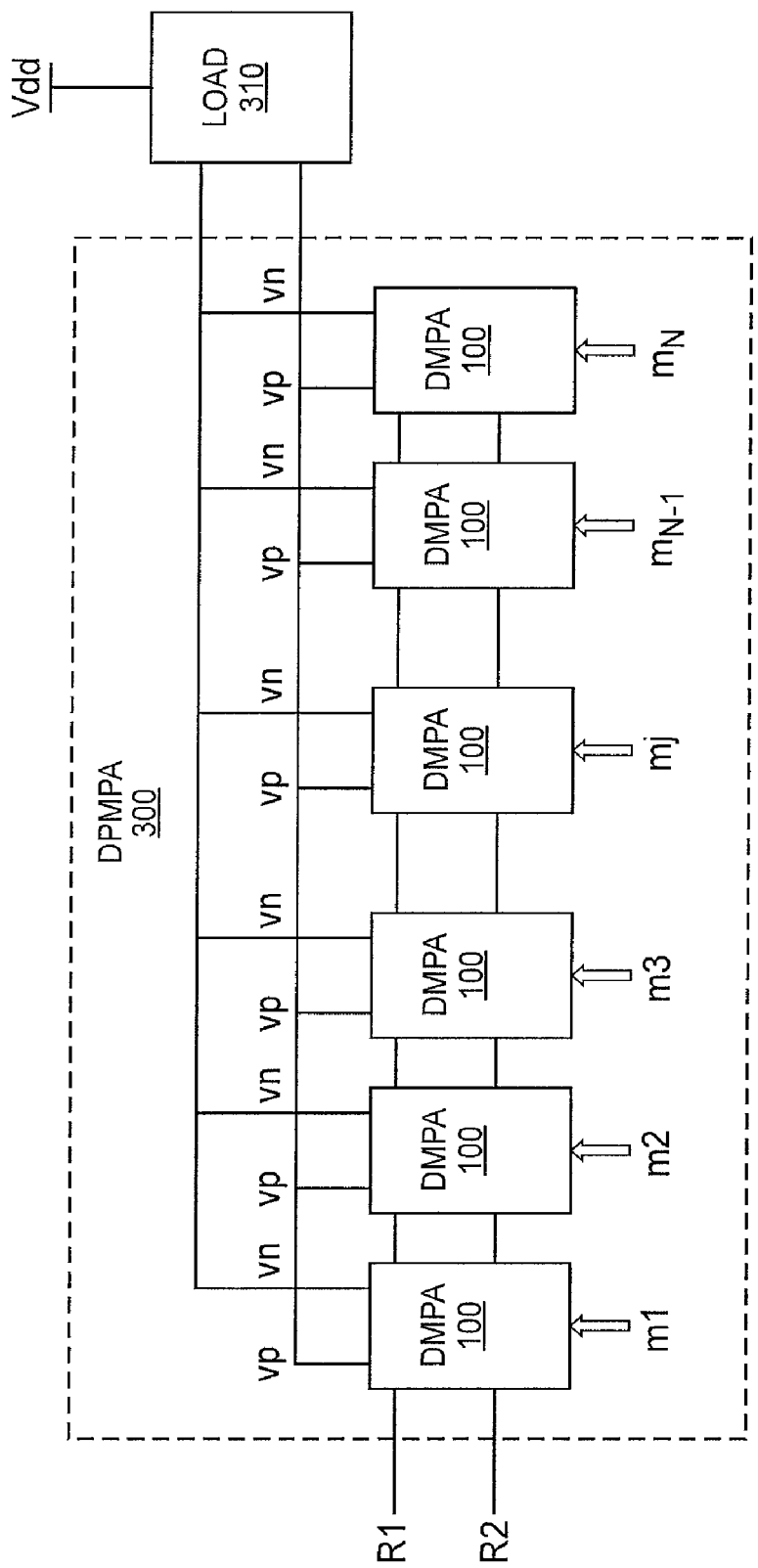
FIG. 3 illustrates a block diagram of an embodiment of a digital polar modulated power amplifier (DPMPA) in an amplitude modulation path formed by K of the DMPA units shown in FIG. 1.

FIG. 3 illustrates an embodiment of a digital polar modulated power amplifier (DPMPA) 300 formed from K of the DMPA units 100 connected in parallel. When a digital modulated RF power amplifier is built with K identical DMPA units 100, K can be very large to reduce quantization noise, and the size of each identical DMPA unit 100 can be relatively small.

Therefore, an impedance compensation circuit 110/200 can be shared by S of the DMPA units 100, where S is an integer <K. Further, the accuracy of the impedance compensation is much lower than the accuracy in quantization, making it possible to share an impedance compensation circuit 110/200 with more DMPA units 100.

Figure 4:
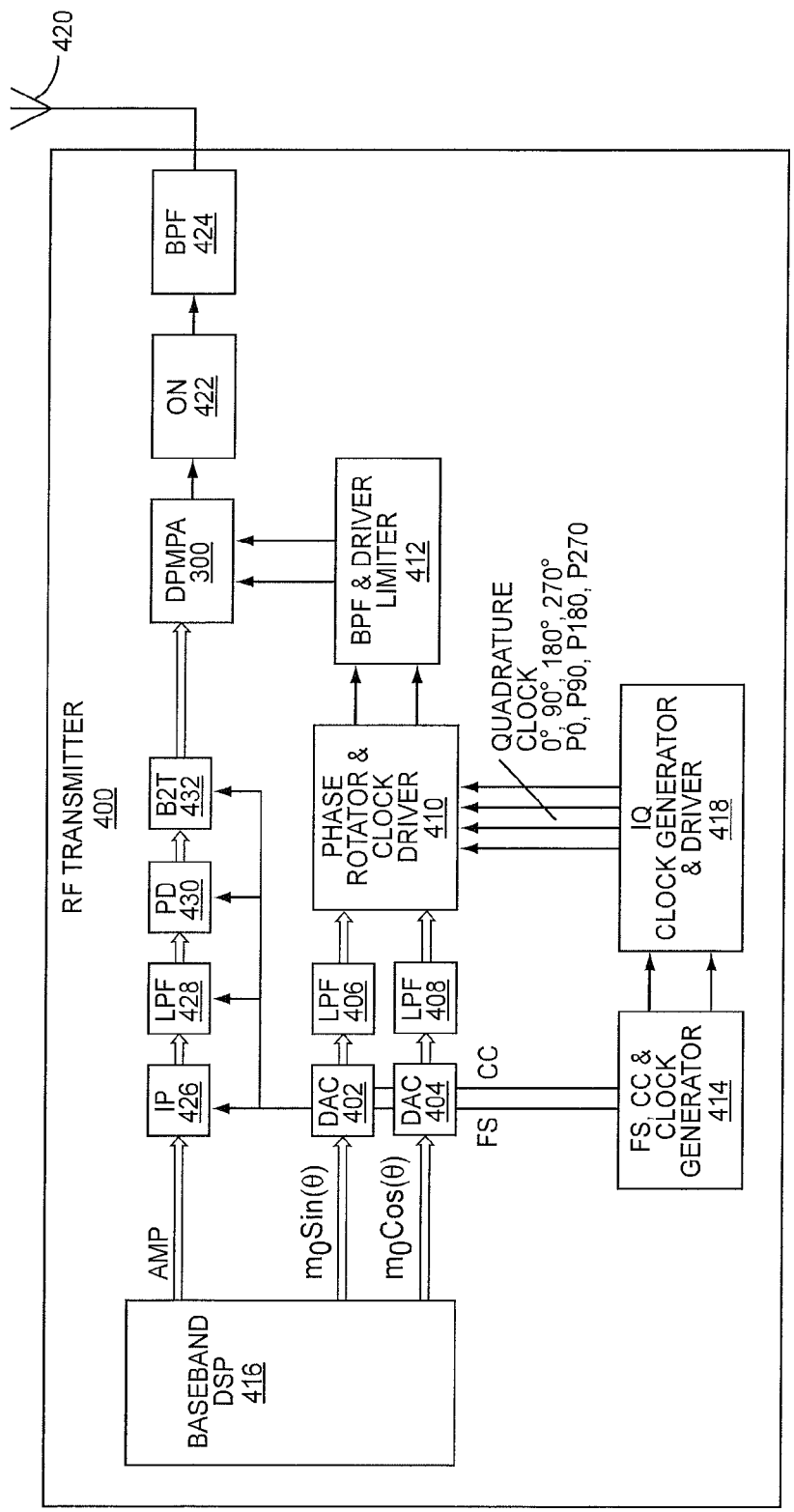
FIG. 4 illustrates a block diagram of an embodiment of an RF transmitter with the DPMPA of FIG. 3 and phase and amplitude modulation paths.

FIG. 4 illustrates an embodiment of an RF transmitter 400 including the digital polar modulated power amplifier 300 of FIG. 3, a phase modulation path and an amplitude modulation path. The phase modulation path includes DACs 402, 404, LPFs 406, 408, an analog phase rotator and clock driver 410, and a bandpass filter and drive limiter 412. Phase modulation can be implemented in many ways. In one embodiment, the analog phase rotator 410 is a class 'A' analog phase rotator which generates complimentary local oscillator clock signals P0, P90, P180 and P270 at a carrier frequency as given by:

$$P0 = c_a \sin(\omega_{tx} t) + DC_b$$

$$P180 = -c_a \sin(\omega_{tx} t) + DC_b$$

$$P90 = c_a \cos(\omega_{tx} t) + DC_b$$

$$P270 = -c_a \cos(\omega_{tx} t) + DC_b \quad (4)$$

where $c_a$ is the clock signal amplitude and $DC_b$ the DC offset.

In the amplitude modulation path, an impedance compensation circuit 110/200 of the kind previously described herein is connected to the load and the differential output nodes of the DPMPA 300 included in the RF transmitter 400. A Phase Locked-Loop (PLL) or a Frequency Synthesizer (FS) clock generator 414 provides differential RF clock signals to the DPMPA 300 for modulation operation of the RF transmitter 400, and also provides lower frequency quadrature clocks and other digital clocks to digital circuits used in the amplitude modulation and phase modulation paths. According to the phase information given by a baseband DSP 416, desired phase modulation is done by the phase rotator 410, generating phase rotated clock signals for the DPMPA 300. The phase rotator 410 can be an analog phase rotator as shown, or a digital phase rotator as will be described in more detail later herein. A voltage controlled oscillator clock output of the clock generator 414 can be used for synchronizing operation. RF LO quadrature clocks P0, P90, P180 and P270 are generated by a clock generator and driver 418, from the differential RF clock generated by the clock generator 414. Delay alignment, between the amplitude modulation path and phase modulation path of the signals input to the DPMPA 300, can be performed by the baseband DSP 416 or via circuit delay implemented in the digital domain by retiming or insertion of delay components such as, e.g. register banks.

The differential output nodes of the DPMPA 300 are connected to an antenna 420 via an output network 422 and a bandpass filter 424. The impedance compensation circuit 110/200 connected between the differential output nodes of the DPMPA 300 provides impedance compensation as a function of the operating state of the DPMPA 300 as previously described herein so that the output network 422 sees relatively constant and matched impedance looking into the DPMPA 300 regardless of the operating state of the DPMPA 300.

During operation, the baseband DSP 416 creates an amplitude signal (Amp) and two sinusoid functions, $m_0 \sin(\theta)$ and $m_0 \cos(\theta)$. The amplitude signal has gain m and is oversampled by an interpolation (IP) unit 426, low-pass filtered by an LPF 428, and pre-distorted by a pre-distortion (PD) unit 430, all in the digital domain in terms of binary format. The binary output is then converted into an RF signal by a DAC function.

In the amplitude modulation path, the DAC function can be implemented in several ways. According to one embodiment as shown in FIG. 4, the binary output is first converted into a thermometer coded output by a binary-to-thermometer (B2T) coder 432. The DMPA units 100 included in the DPMPA 300 are then driven by the B2T coder 432. According to another embodiment, over-sampling sigma-delta conversion is employed, and the LPF 428 suppresses the noise spectrum at higher frequency ranges. A third alternative is to use a time-interleaved linear interpolation technique.

The alignment between the amplitude signal and the phase signal can be performed at the baseband DSP 416, and fine tuning can be done at the amplitude path, where multi-phase clocks can be used for retiming the delay. The clock driver circuit 418 provides quadrature clock signals (0°, 90°, 180° and 270°) to the phase rotator 410 responsive to clock signals generated by the clock generator circuit 414. The clock generator circuit 414 also provides DAC conversion reconstruction clocks (FS) and a control clock (CC). The phase modulation path changes carrier clock phases used in the amplitude modulation path. The DPMPA 300 generates a modulated RF signal, enlarges the signal to a desired power level, and feeds the signal to the output network 422 which is then filtered for transmission.

Figure 5:
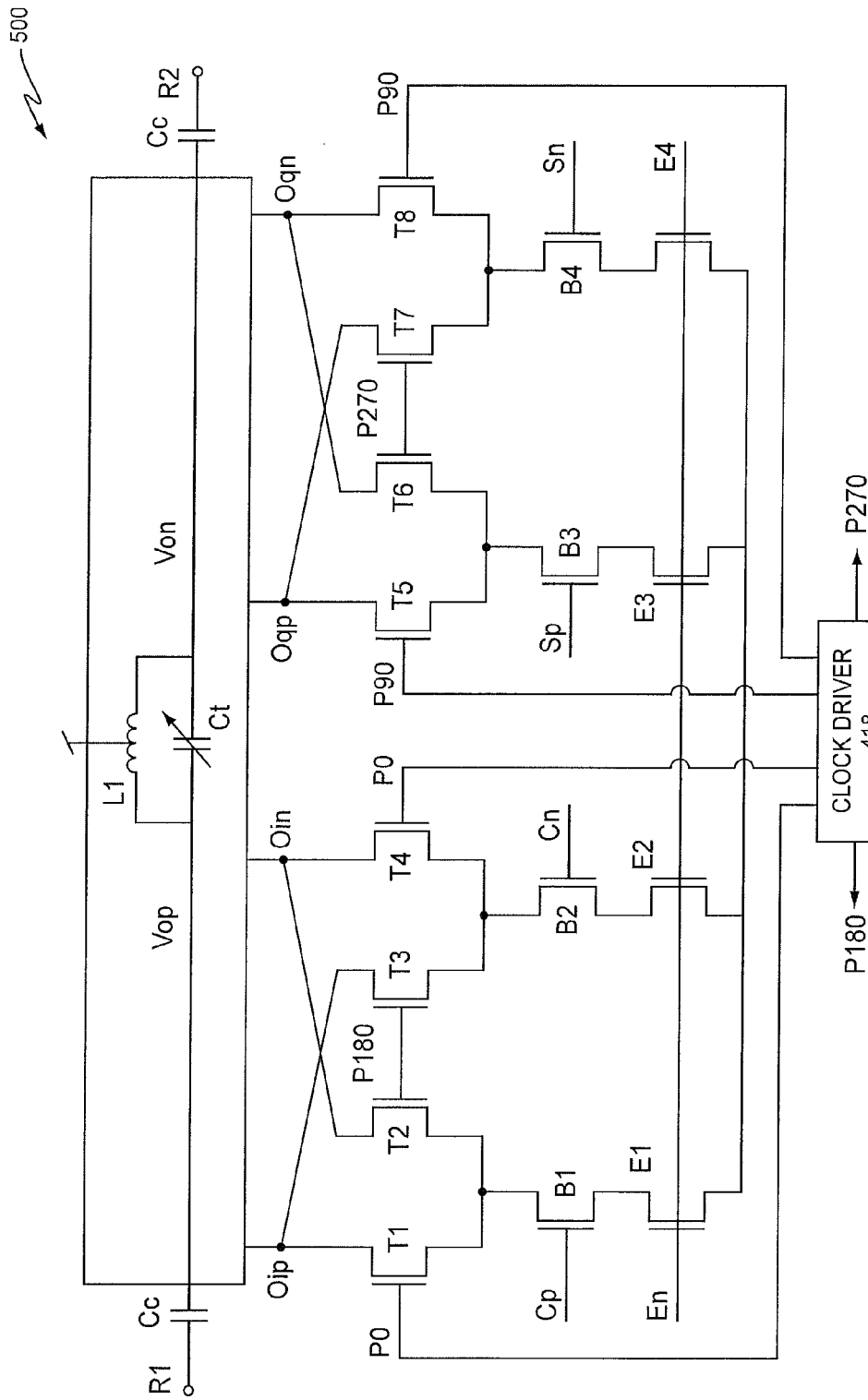
FIG. 5 illustrates a circuit diagram of an embodiment of an analog phase rotator in the phase modulation path of the DPMPA.

FIG. 5 illustrates an embodiment of an analog implementation of the phase rotator 410 in the phase modulation path of the RF transmitter 400, as an analog phase rotator 500. The analog phase rotator 500 also has a bandpass filter function because a tunable tank (L1, Ct) is used as the load of the analog phase rotator 500. The analog phase rotator 500 can also drive some capacitive load through a coupling capacitance Cc at a lower power consumption since the capacitive load is included in the total capacitance resonating at carrier frequency in the tank. Additional bandpass filter functions and driver stages (e.g., limiter, amplifier, etc.) can be inserted for driving the DPMPA, which is not shown here. The bandpass filter stages can purify the LO (local oscillator) spectrum by suppressing phase noise, which is important for saw-less transmitter design because the LO phase noise normally is not low enough. Otherwise, this noise may leak into a corresponding receiver front-end (not shown) and desensitize the sensitivity of a corresponding low noise amplifier (LNA).

In more detail, transistors T1-T8 are connected to the quadrature LO clocks P1, P90, P180 and P270, respectively. Tail transistors B1-B4 are connected to the sinusoid like phase modulation signals Cp, Cn, Sp and Sn, respectively. The analog phase rotator 500 functions similar to a mixer, but is instead mixed by a complex rotation signal with amplitude amp given by:

$$\mathrm{amp} = \sqrt{Cp^2 + Sp^2} = M_0 \quad (4)$$

This in turn yields:

$$\sin(\omega_{tx} t) M_0 \cos(\theta) \pm \cos(\omega_{tx} t) M_0 \sin(\theta) = M_0 \sin(\omega_{tx} t \pm \theta) \quad (5)$$

If node Oip is connected to node Oqp and node Oin is connected to node Oqn, then the rotation is clockwise, yielding an instantaneous output frequency of $f_{pm} = f_{tx} + f_m$, where $$f_m = \frac{d\theta}{2\pi dt}.$$

If node Oip is connected to node Oqn and node Oin is connected node Oqp, then the rotation is anti-clockwise, yielding an instantaneous output frequency $f_{pm} = f_{tx} - f_m$. Modifying $M_0$ can change the amplitude of the output, and thus the gain. The gain can also be changed in accordance with equation (1) by reducing the number of enabled units. The phase modulation signals Cp, Cn, Sp and Sn can be created by the baseband DSP 416, or other methods. When Cp, Cn, Sp and Sn are created by the baseband DSP 416, any desirable digital compensation may also be performed by the baseband DSP 416.

Figure 6:
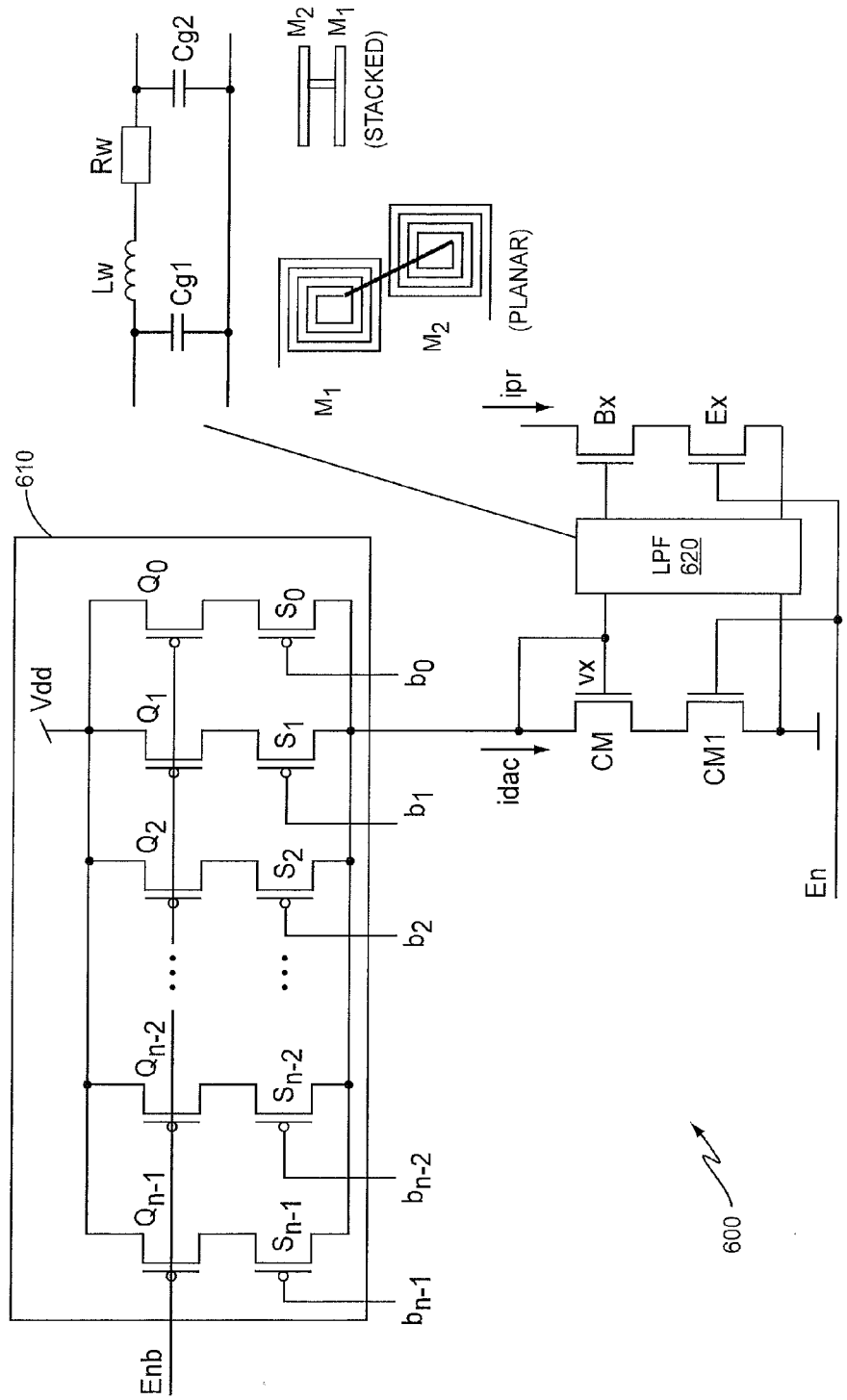
FIG. 6 illustrates a circuit diagram of an embodiment of a tail current setting circuit connected to the analog phase rotator of FIG. 5.

FIG. 6 illustrates an embodiment of a tail current setting circuit 600 for modulating the LO quadrature clocks in the rotation of the analog phase rotator 500. A current DAC (digital to analog converter) 610 includes transistor pairs $Q_j$ and $S_j$, where $j=0, 1, 2, \ldots n-1$. The tail current setting circuit 600 sums up the current, idac, from all enabled branches among the n current source branches. The current ipr in tail transistor Bx, $x=1, 2, 3, 4$, of the analog phase rotator 500 is proportional to the current idac.

The current source branches of the tail current setting circuit 600 can be either binary weighted or thermometer coded. To compensate for non-linearity in the analog phase rotator, the size of the transistors $S_j$ in the current source branches may be non-uniform sized. Enable transistor $Q_j$ is controlled by an enable signal Enb, and only when Enb is logic low the DAC 610 is enabled. Enable transistor $Q_j$ also increases the output impedance that is required for a current source. The control signal En is the enable signal for NMOS transistors CM and Ex, and only when En is logic high do the transistors conduct. Control signals En and Enb are complementary. Transistor $S_j$ is driven by a binary signal $b_j$, which can work in a static logic mode, or an over-sampled sigma-delta mode, or a time interleaved mode.

An LPF 620 is inserted at the output node (vx) of the current sink. The LPF 620 removes the noise caused by reconstruction noise such as quantization noise, high order harmonics of the sampling frequency, noise spectrum in oversampling sigma-delta conversion, etc. An exemplary $2^{nd}$ order LPF can be seen in the upper right-hand corner of FIG. 6. The inductance Lw of the exemplary $2^{nd}$ order LPF can be implemented on silicon with multi-layer metal wires. The inductance built with multi-layer metal wires can be planar or stacked for area reduction as shown below the exemplary $2^{nd}$ order LPF in FIG. 6, where Rw corresponds to the parasitic resistance of the wires, Cg1 and Cg2 corresponds to the parasitic capacitors of the metal wires, gate capacitors and gate parasitic capacitors of the tail transistor. A higher-order LPF can also be employed. The phase rotator 500 can also be implemented in the digital domain.

Figure 7:
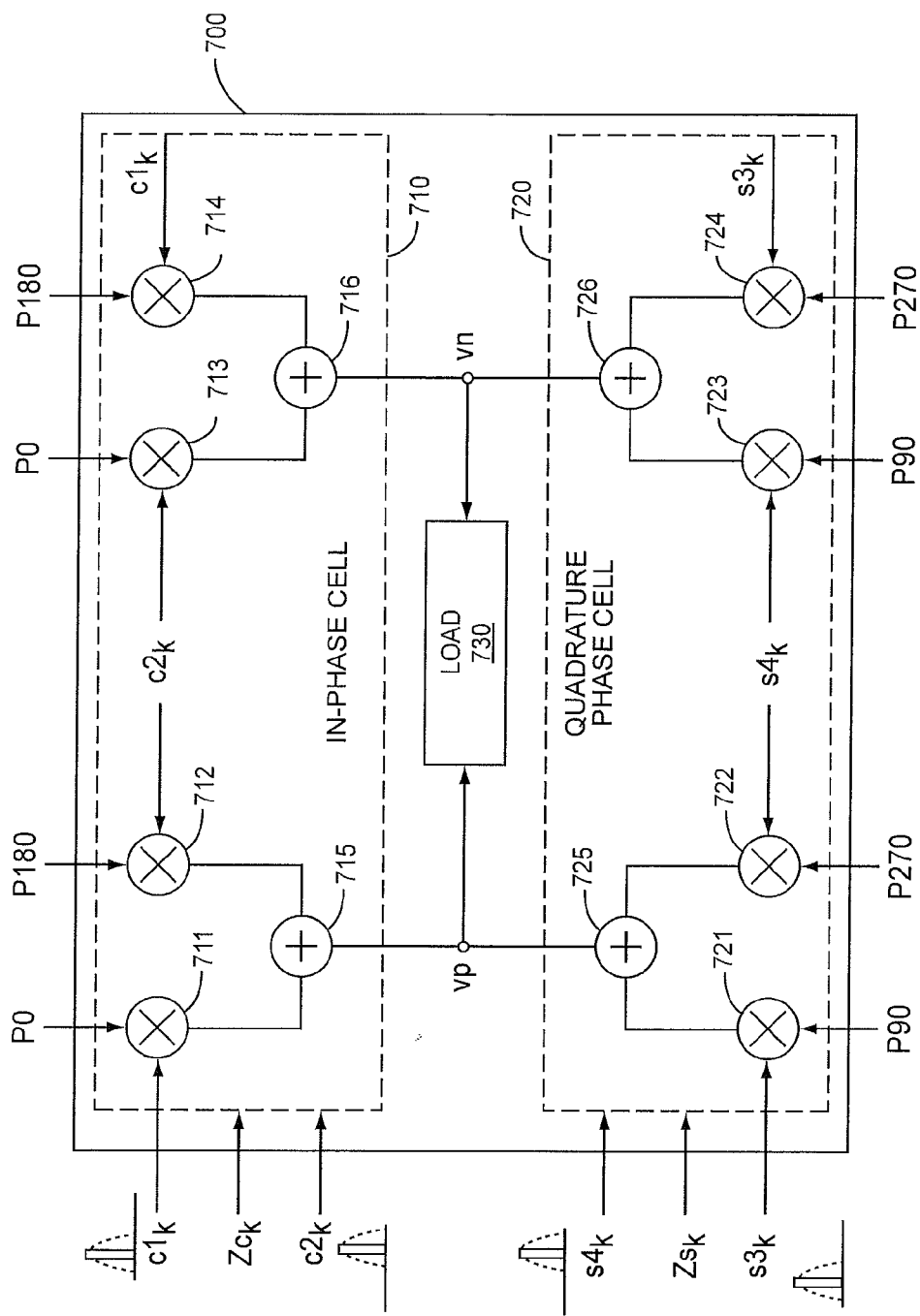
FIG. 7 illustrates a circuit diagram of a digital phase rotator cell in the phase modulation path of the DPMPA.

FIG. 7 illustrates an embodiment of a digital phase rotator in the phase modulation path of the RF transmitter 400, as a digital positive coefficient quadrature modulator (DPCQM) 700. The DPCQM 700 is implemented as parallel switched cells and each includes an in-phase cell 710 and a quadrature cell 720. The in-phase and quadrature cells 710, 720 each include four multipliers 711-714, 721-724 and two adders 715-716, 725-726, respectively, and impart phase modulation on a load 730. Two non-negative digital phase modulation signals (c1 and c2) and two complementary oscillating clock signals (P0 and P180) are input to the in-phase cell 710, where k in FIG. 7 indicates the kth unit cell DPCQM 700. Two different non-negative digital phase modulation signals (s3 and s4) and two different complementary oscillating clock signals (P90 and P270) are input to the quadrature cell 720. A modulation signal (Zc, Zs) is also input to the in-phase and quadrature cells 710, 720 for controlling the operation of any impedance compensation and/or shut-down circuitry (not shown in FIG. 7) connected to the DPCQM 700 as previously described herein. The differential output nodes vn and vp of the DPCQM 700 are connected to the load 730 for imparting phase modulations on the load 730.

In more detail, the in-phase cell 710 generates differential in-phase signals responsive to the state of the digital phase modulation signals c1 and c2 and the complementary oscillating clock signals P0 and P180 input to the in-phase cell 710. The quadrature cell 720 similarly generates differential quadrature signals responsive to the state of the digital phase modulation signals s3 and s4 and the complementary oscillating clock signals P90 and P270 input to the quadrature cell 820. A phase modulated output is generated by coupling the differential outputs of the in-phase and quadrature cells 710, 720 to the load 730. Each of the digital phase modulation signals c1, c2, s3 and s4 input to the DPCQM 700 is valid only if its corresponding amplitude is larger than zero, i.e. non-negative, otherwise the phase modulation signal is set to zero. Hence, the phase rotator is referred to as a positive coefficient quadrature modulator. The DPCQM 700 can be implemented in various ways with or without the impedance compensation and shut-down circuitry previously described herein.

Figure 8:
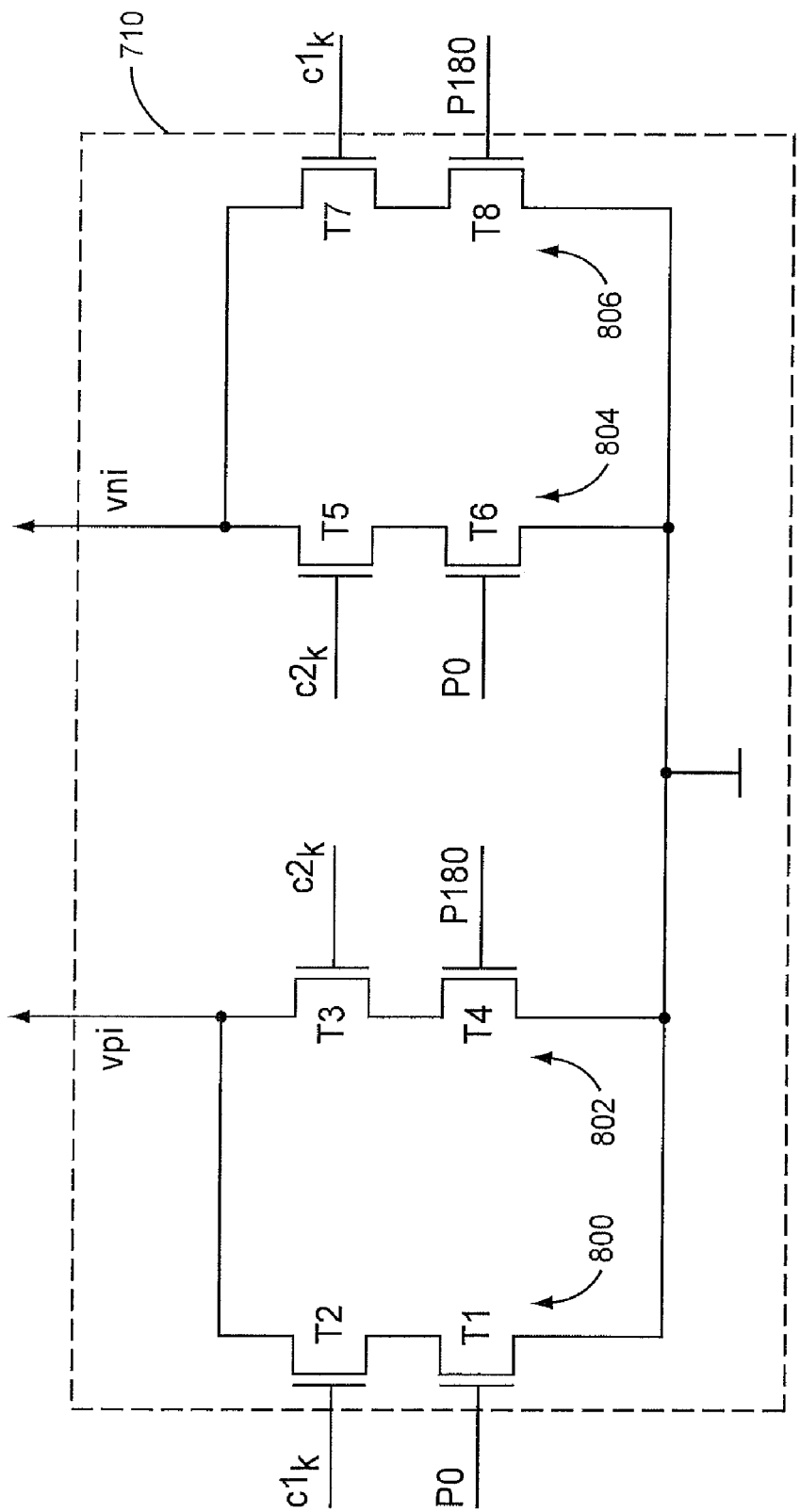
FIG. 8 illustrates a circuit diagram of an embodiment of an in-phase cell of the digital phase rotator of FIG. 7.

FIG. 8 illustrates an embodiment of the in-phase cell 710 of the DPCQM 700. Those skilled in the art will readily recognize that the quadrature cell 720 of the DPCQM 700 can be implemented in a similar fashion. Each branch 800, 802, 804, 806 of the in-phase cell 710 includes a common source transistor (T1, T4, T6, T8) connected in series with a common gate transistor (T2, T3, T5, T7). The drains of the common source and common gate transistors for each branch 800, 802, 804, 806 are electrically connected together. The source of each common gate transistor is connected to one output node (vpi or vni) of the in-phase cell 710. The gate of each common gate transistor is connected to a first control node of the branch (i.e., the input node for clock signal P0 or P180). The source of each common source transistor is connected to a supply node and the gate of each common source transistor is connected to a second control node of the branch (i.e., the input node for digital phase modulation signals $c1_k$ and $c2_k$). The NMOS transistors T2, T3, T5 and T7 operate in a switch mode responsive to the digital phase modulation signals $c1_k$ and $c2_k$. The NMOS transistors T1, T4, T6 and T8 are RF transistors connected to the complementary local oscillator clock signals P0 and P180. An in-phase differential signal is output at the output nodes vpi and vni of the in-phase cell 710. A corresponding quadrature differential signal can be output by the quadrature cell 720 of the clock rotator component in a similar manner.

Figure 9:
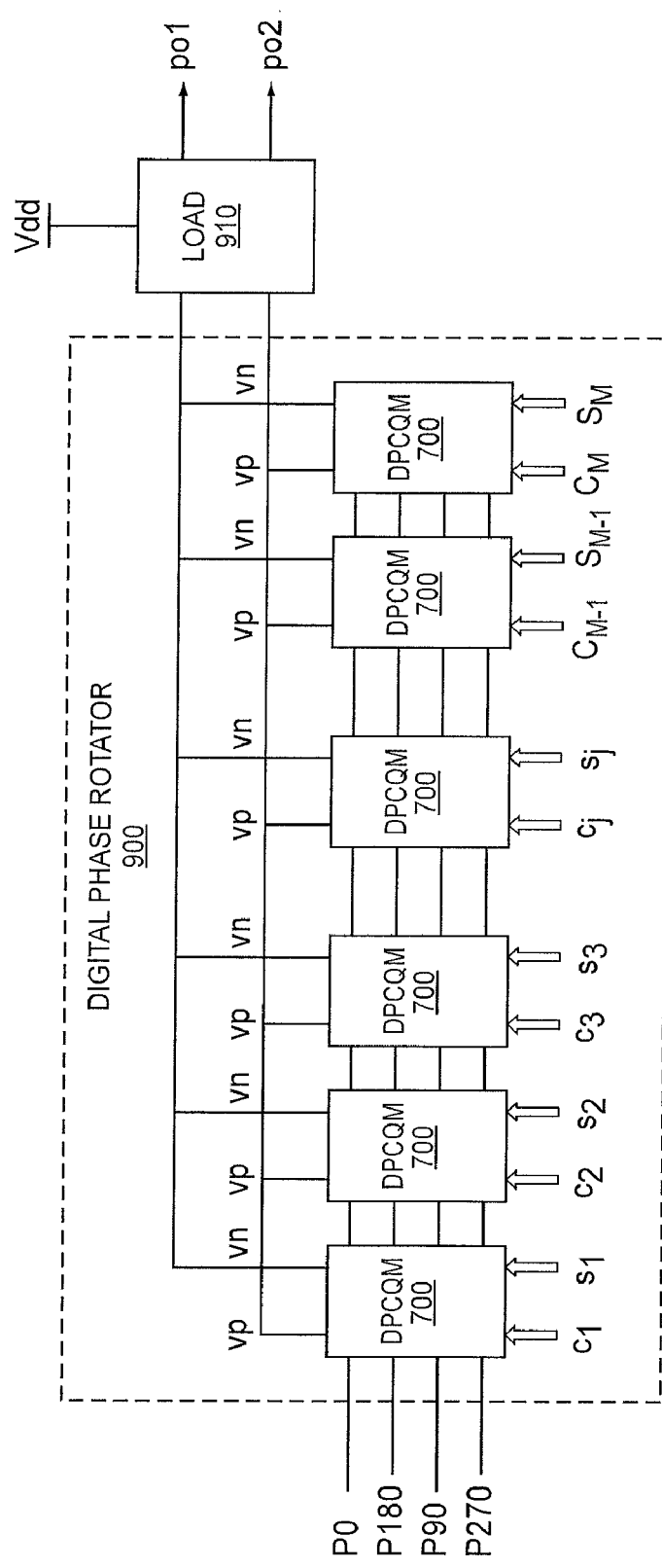
FIG. 9 illustrates a block diagram of an embodiment of a digital phase rotator including a plurality of the digital phase rotator cells of FIG. 8.

FIG. 9 illustrates an embodiment of a digital phase rotator 900, including a plurality of the DPCQMs 700 shown in FIG. 7. The digital phase rotator 900 has M of the DPCQMs 700 coupled together in parallel for driving a load 910 which can be a tunable LC tank with capacitive coupled complementary outputs, po1 and po2. The po1 and po2 signals can be amplified or buffered with one or several active BPFs, and finally differential signals are created at its output side, and the outputs are used to drive the DPMPA 300. The non-linear distortion in digital phase rotator 900 can be compensated by the DSP 416 in the digital baseband domain, by pre-distortion of the phase modulation signals using a stored look-up table.

With the above range of variations and applications in mind, it should be understood that the present invention is not limited by the foregoing description, nor is it limited by the accompanying drawings. Instead, the present invention is limited only by the following claims, and their legal equivalents.

What is claimed is:
1. A digital modulated power amplifier unit, comprising:
a differential radio frequency (RF) amplifier circuit having differential output nodes, a digital modulation signal input and complementary clock signal inputs, the differ- ential RF amplifier circuit comprising a first pair of transistors operable to receive a digital modulation signal and a second pair of transistors operable to receive complimentary clock signals; and an impedance compensation circuit connected between the differential output nodes of the differential RF amplifier circuit, the impedance compensation circuit comprising a transistor connected in series between first and second RC circuits, the transistor operable to electrically connect and disconnect the first RC circuit and the second RC circuit responsive to the digital modulation signal.

2. The digital modulated power amplifier unit of claim 1, wherein each of the RC circuits comprises a capacitor connected in parallel with a resistor.

3. The digital modulated power amplifier unit of claim 1, wherein each of the RC circuits comprises at least one of a tunable capacitive device and a tunable resistive device connected in parallel with a resistor and a capacitor.

4. The digital modulated power amplifier unit of claim 1, further comprising a shut-down circuit to couple drains of the second pair of transistors to a reference voltage in response to the digital modulation signal.

5. A digital polar modulated power amplifier comprising a plurality of the digital modulated power amplifier units of claim 1 connected in parallel, wherein two or more of the digital modulated power amplifier units share a single impedance compensation circuit.

6. The digital polar modulated power amplifier of claim 5, further comprising:

a phase modulation path having differential output nodes to deliver phase modulated complimentary clock signals, wherein the phase modulation path includes a phase rotator operable to receive local oscillator signals and phase modulation signals and to generate the phase modulated complimentary clock signals.

7. The digital polar modulated power amplifier of claim 6, wherein the phase rotator is an analog phase rotator comprising at least one pair of transistors operable to receive the local oscillator signals, at least one tail transistor operable to receive a phase modulation signal and a bandpass filter operable to suppress phase noise generated by the analog phase rotator.

8. The digital polar modulated power amplifier of claim 7, wherein the analog phase rotator further comprises a tail current setting circuit operable to set a current in the at least one tail transistor, wherein the tail current setting circuit comprises a digital-to-analog converter and a low pass filter, the digital-to-analog converter having a plurality of current source branches and being operable to generate a current at an output node corresponding to how many of the current source branches are enabled, the low pass filter being operable to couple the output node of the digital-to-analog converter to the tail transistor of the phase rotator and filter noise present at the output node of the digital-to-analog converter.

9. The digital polar modulated power amplifier of claim 8, wherein the current source branches comprise non-uniform sized transistors operable to compensate for non-linearity in the analog phase rotator.

10. The digital polar modulated power amplifier of claim 8, wherein the low pass filter is an on-chip low pass LRC filter, wherein the inductors are implemented on silicon with metal wires, the resistors are implemented as parasitic resistors of the metal wires and the capacitors are implemented as parasitic capacitors of the metal wires, gate capacitors and gate parasitic capacitors of the tail transistor.

11. The digital polar modulated power amplifier of claim 6, wherein the phase rotator is a digital phase rotator comprising plurality of digital phase rotator units, wherein each digital phase rotator unit comprises at least one first pair of transistors operable to receive the phase modulation signals and at least one second pair of transistors operable to receive the local oscillator signals.

12. The digital polar modulated power amplifier of claim 6, further comprising a band-pass filter and a driver limiter connected to the outputs of the phase rotator.

13. The digital polar modulated power amplifier of claim 6, wherein non-linearity of the phase rotator is compensated for by pre-distortion of the phase modulation signals in the digital domain.

14. The polar modulated power amplifier of claim 6, wherein the phase rotator comprises a differential digital positive coefficient quadrature modulator operable to interleave a non-negative portion of the phase modulation signals and clip a negative portion of the phase modulation signals to zero.

15. A method of operating a digital modulated power amplifier unit including a differential radio frequency (RF) amplifier circuit with differential output nodes, a digital modulation signal input and complimentary clock signal inputs, the method comprising:

receiving a digital modulation signal at a first pair of transistors of the differential RF amplifier circuit;

receiving complimentary clock signals at a second pair of transistors of the differential RF amplifier circuit;

connecting an impedance compensation circuit between the differential output nodes of the differential RF amplifier circuit; and electrically connecting and disconnecting first and second RC circuits of the impedance compensation circuit between the differential output nodes of the differential RF amplifier circuit responsive to the digital modulation signal received at a transistor connected in series between the first and second RC circuits.

16. The method of claim 15, further comprising coupling each drain of the second pair of transistors to a reference voltage in response to the digital modulation signal.

17. The method of claim 15, further comprising:

coupling a plurality of the digital modulated power amplifier units in parallel; and coupling the differential output nodes of two or more of the digital modulated power amplifier units to a single impedance compensation circuit.

18. The method of claim 17, further comprising:

providing a phase modulation path having differential output nodes for delivering phase modulated complimentary clock signals;

receiving local oscillator clock signals and phase modulation signals at a phase rotator of the phase modulation path; and outputting the phase modulated complimentary clock signals from the phase rotator.

19. The method of claim 18, wherein the phase rotator is an analog phase rotator having at least one pair of transistors that receives the local oscillator signals, at least one tail transistor that receives the phase modulation signal and a bandpass filter that suppresses phase noise generated by the analog phase rotator.

20. The method of claim 19, wherein the analog phase rotator further comprises a tail current setting circuit that sets a current in the tail transistor, wherein the tail current setting circuit comprises a digital-to-analog converter and a low pass filter, the digital-to-analog converter having a plurality of current source branches that generate a current at an output node corresponding to how many of the current source branches are enabled, the low pass filter coupling the output node of the digital-to-analog converter to the tail transistor of the phase rotator and filtering noise present at the output node of the digital-to-analog converter.

21. The method of claim 20, comprising compensating for non-linearity in the analog phase rotator using non-uniform sized transistors included in the plurality of current source branches.

22. The method of claim 18, wherein the phase rotator is a digital phase rotator comprising plurality of digital phase rotator units, wherein each digital phase rotator unit comprises at least one first pair of transistors that receives the phase modulation signals and at least one second pair transistors that receives the local oscillator signals.

23. The method of claim 18, further comprising connecting a band-pass filter and a driver limiter to the outputs of the phase rotator.

24. The method of claim 18, comprising pre-distorting the phase modulation signals in the digital domain to compensate for non-linearity of the phase rotator.

25. The method of claim 18, comprising interleaving a non-negative portion of the phase modulation signals and clipping a negative portion of the phase modulation signals to zero using a differential digital positive coefficient quadrature modulator component of the phase rotator.

* * * * *

UNITED STATES PATENT AND TRADEMARK OFFICE
CERTIFICATE OF CORRECTION

| | |
|---|---|
| PATENT NO. | : 7,978,009 B2 |
| APPLICATION NO. | : 12/630320 |
| DATED | : July 12, 2011 |
| INVENTOR(S) | : Mu |

It is certified that error appears in the above-identified patent and that said Letters Patent is hereby corrected as shown below:

In Column 12, Line 13, in Claim 14, delete "polar" and insert -- digital polar --, therefor.

Signed and Sealed this
Seventh Day of February, 2012

David J. Kappos
*Director of the United States Patent and Trademark Office*